United States Patent [19]

Lamson

[11] Patent Number: 5,160,893
[45] Date of Patent: Nov. 3, 1992

[54] METHOD OF MEASURING SEMICONDUCTOR LEAD INDUCTANCE BY CHANGING THE DIELECTRIC CONSTANT SURROUNDING THE LEAD

[75] Inventor: Michael A. Lamson, Van Alstyne, Tex.

[73] Assignee: Texas Instruments Incorporated, Dallas, Tex.

[21] Appl. No.: 705,475

[22] Filed: May 24, 1991

[51] Int. Cl.⁵ ............................................. G01R 27/26
[52] U.S. Cl. .................................. 324/654; 324/533; 324/158 R
[58] Field of Search ............... 324/649, 650, 654, 655, 324/532, 533, 158 R

[56] References Cited

U.S. PATENT DOCUMENTS 3,942,108  3/1976  Potter .................................. 324/655

Primary Examiner—Jack B. Harvey
Attorney, Agent, or Firm—B. Peter Barndt; Richard L. Donaldson

[57] ABSTRACT

Measurements for inductance and capacitance at various frequencies have been made on semiconductor device to determine inductance of the leads of the device. The measurement methods involve a Time Domain Reflectometer in a unique application in which the leads of the device being measured are submerged in a liquid during measurements.

7 Claims, 2 Drawing Sheets

| METHOD COMPARISON INDUCTANCE (Nanohenries) | | |
|---|---|---|
| FREQUENCY (MHz) | HP4191A IMPEDANCE ANALYZER | TIME DOMAIN REFLECTOMETER |
| 10 | 8.69 | – |
| 20 | 8.56 | – |
| 30 | 8.45 | – |
| 40 | 8.40 | – |
| 50 | 8.31 | – |
| 60 | 8.25 | – |
| 70 | 8.24 | 7.97 |

METHOD OF MEASURING SEMICONDUCTOR LEAD INDUCTANCE BY CHANGING THE DIELECTRIC CONSTANT SURROUNDING THE LEAD

BACKGROUND OF THE INVENTION

The trend toward faster integrated circuit chips, increased power, and higher lead count is necessitating the prediction and control of the electrical parameters of the packaging system in order to insure proper signal transmission and power and ground behavior. The degree of the detrimental effects caused by the electrical parameters such as inductance and capacitance will, in general, be frequency dependent.

Higher lead counts promote longer and narrower leads resulting in increased self inductance for the package leads.

Higher power and resultant increased power supply current will negatively impact the inductive "ground bounce" problems observed in packaging systems. Other problems effected are ringing or oscillations and time delay.

The accurate measurement of inductance values is therefore important in determining the performance of integrated circuit packages and interconnection systems.

BRIEF SUMMARY OF THE INVENTION

The invention is a method to improve the accuracy of inductance measurements of leads on semiconductor devices by the time domain reflectometer technique. This method involves the application of a fast rise time voltage pulse to the package lead. The amplitude of the reflected voltage wave is proportional to the impedance of the conductor being measured. The inductance is calculated from the integration of impedance over time. The accuracy of the measurement can be improved by slowing down the wave front of the reflected wave. The wave front of the reflected wave is slowed by increasing the dielectric constant of the medium surrounding the lead. When the leads are exposed as in the case of TAB interconnections on printed circuit boards, the device and leads under test can be immersed in a high dielectric constant fluid, such as water, or another appropriate fluid, and the reflected wave front will decrease in speed. The amount of decrease is proportional to the square root of the ratios of the dielectric constant change. In the case of water replacing air, the velocity of the reflected wave will decrease by a factor of nine. The immersion of the lead will effect the capacitance, but the inductance will remain constant.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figures 1, 4:
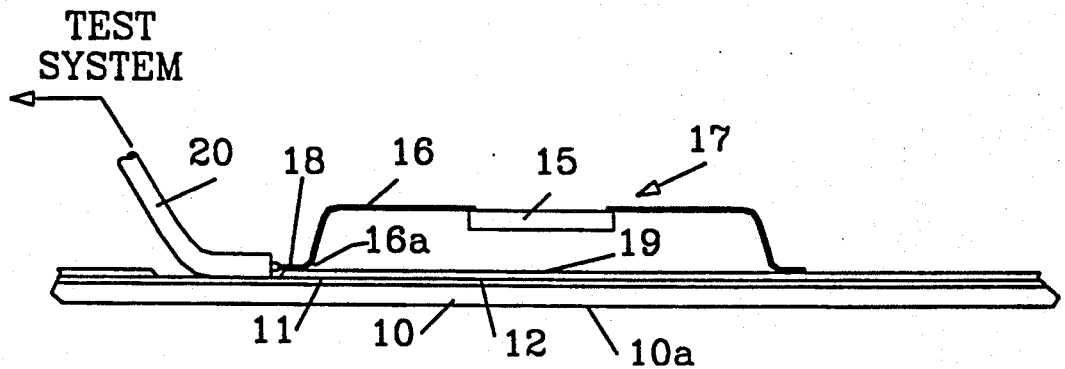
FIG. 1 the measurement set-up for measuring TAB packages.
FIG. 4 lists inductance measurements for a Tab package using a standard impedance analyzer method and the TRD method.

FIG. 1 shows a measurement set-up when using the method according to the present invention. A prime consideration in measuring the electrical parameters of IC packages components is to insure that the actual use conditions are replicated as near as possible. In the case of the TAB package, the test unit is mounted on a printed circuit board as it is in actual use (See FIG. 1). Printed circuit board 10 has a ground plane 11 between the two surfaces 10a and 12. Semiconductor device 17 is a TAB package device with lead 16 bonded directly to the semiconductor chip 15. Lead 16 is connected to a conductor 19 on the surface of printed circuit board 10 during normal operation. When making electrical parameter measurements, the tip 16a of lead 16 is connected to the center lead 18 of a 50 ohm coaxial cable 20 that is connected to the measuring instrument (not illustrated). The internal ground plane 11 of the printed circuit board is use as the reference ground plane for all measurements.

Measurements were taken on the TAB longest lead using a Time Domain Reflectometer (TRD). This apparatus displays the reflected wave of a high speed voltage step (35 pSec. rise time) injected into the package lead from a 50 ohm line. The magnitude of the reflected wave is proportional to the impedance change encountered by the applied voltage step. The impedance at any point on the package lead can then be calculated from the reflected voltage at that point, Vx, the reflected voltage from an open circuit, Vinf, and the reflected voltage from a fifty ohm line, V50, as:

$$Z = 50*(Vinf - V50)/(Vinf - Vx) \qquad \text{Eq. 1}$$

The total inductance for the lead is calculated from each value of Z and the time increment, dt, between data points as:

$$L = SUM(Z(t)*dt) \qquad \text{Eq. 2}$$

Figure 2:
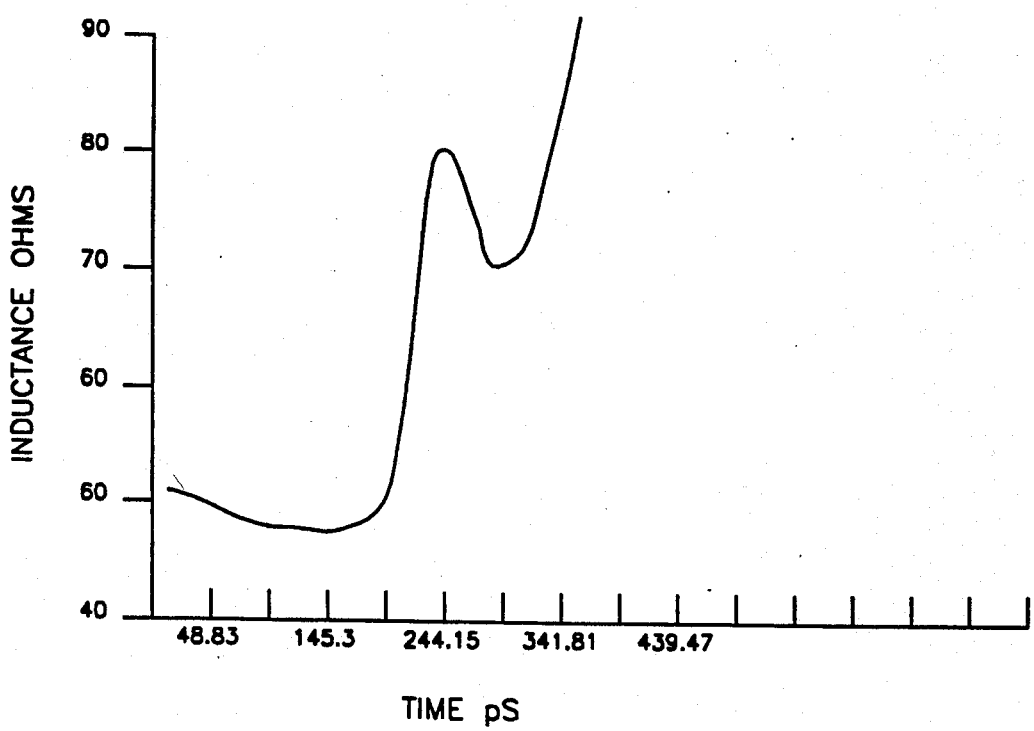
FIG. 2 is a plot of impedance vs time for a low dielectric constant.
Figure 3:
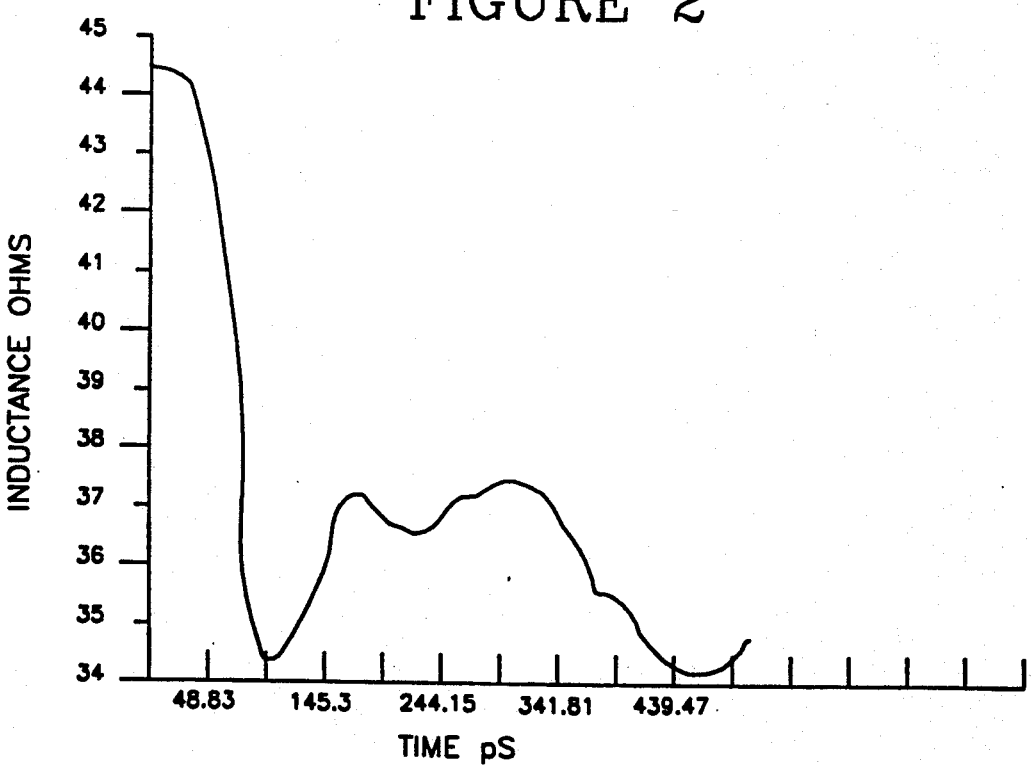
FIG. 3 is a plot of impedance vs time for a high dielectric constant.

For short traces or low dielectric constant materials, this method is normally inaccurate since the impedances do not attain their ultimate values due to the finite rise time of the instrument and difficulties in locating the start and end point of the package lead from the voltage plots. The impedance of the lead vs time as measured under normal conditions is illustrated in FIG. 2. It should be noted that the plot changes rapidly and only a single pulse approximating the true impedance value is displayed. The wave, however, can be slowed down by changing the dielectric constant of the medium around the lead. If the lead is exposed, as in the case of the TAB mounted units, a fluid with a high dielectric constant (i.e. DI water, er=80), is added to the area around the leads. This effect is illustrated in FIG. 3 where additional features indicated by the impedance changes are clearly evident due to the slower wave front. This will have a significant effect on the capacitance measured, but no influence on the inductance. As the dielectric constant increases, the impedance will decrease, the transition time will increase and the inductance value as calculated from Equation 1 will remain constant. With the transition time increased significantly, the impedance values are more accurate and the endpoints are more easily determined.

Impedance plots in FIGS. 2 and 3 are for a TAB unit and are for low and high dielectric constant mediums respectively. The initial downward slope in the TDR trace in FIG. 3 is the external lead of the TAB lead frame. The center plateau is an area of lower capacitance where the lead is attached to a polyimide layer on the leadframe. The inductance value has been calculated from the data in the TDR trace of FIG. 3 using Equation 2. The inductance was also measured on the same lead using a HP4191A Impedance Analyzer and the results are given in FIG. 4. The Impedance Analyzer measurements were made between 10 Mhz and 70 Mhz. The TDR method is equivalent to a very high frequency technique so the comparison is shown at 70 Mhz.

It should be noted that in using the Impedance Analyzer, it is required that the lead tip be connected to the ground plane. This implies a destructive test condition. The TDR requires no such attachment. Also, the TDR trace shows various elements of differing electrical characteristics along the lead path. the inductance for each element can be calculated individually.

What is claimed:

1. A method for improved accuracy of inductance measurements on leads of a circuit board mounted semiconductor device using an inductance test system, comprising the steps of:

attaching a coaxial cable between the test system and the lead to be measured;

connecting the coaxial cable to the lead and to a ground plane on the circuit board;

changing the dielectric constant around the lead; and measuring the inductance of the lead.

2. The method according to claim 1, including the step of immersing the lead in a liquid to change the dielectric constant around the lead.

3. The method according to claim 2, wherein the liquid is water.

4. The method according to claim 1, including the step of:

making a series connection between two leads of the device under test.

5. The method according to claim 4, including the step of:

immersing the device under test in a liquid to change the dielectric constant around the lead.

6. A method for improved accuracy of inductance measurements on leads of a circuit board mounted semiconductor device using an inductance test system, comprising the steps of:

attaching a coaxial cable between the test system and the lead to be measured;

making coaxial cable compensation readings prior to connecting the coaxial;

connecting the coaxial cable to the lead and to a ground plane on the circuit board;

changing the dielectric constant around the lead by immersing the device and lead in a liquid; and measuring the inductance of the lead.

7. The method according to claim 6, wherein the liquid is water.

* * * * *